(12) United States Patent
Lang et al.

(10) Patent No.: US 6,426,561 B1
(45) Date of Patent: Jul. 30, 2002

(54) SHORT-CIRCUIT-RESISTANT IGBT MODULE

(75) Inventors: Thomas Lang, Zurich; Hans-Rudolf Zeller, Birr, both of (CH)

(73) Assignee: ABB Schweiz Holding AG, Baden (CH)

( * ) Notice: Subject to any disclaimer, the term of this patent is extended or adjusted under 35 U.S.C. 154(b) by 0 days.

(21) Appl. No.: 09/394,717

(22) Filed: Sep. 13, 1999

(30) Foreign Application Priority Data

Sep. 22, 1998 (DE) .......................................... 198 43 309

(51) Int. Cl.⁷ ............................................... H01L 23/48
(52) U.S. Cl. ........................................ 257/779; 257/678
(58) Field of Search ................................ 257/779, 678, 257/725, 720, 181, 730, 723

(56) References Cited

U.S. PATENT DOCUMENTS

| | | | |
|---|---|---|---|
| 3,852,805 A | | 12/1974 | Brzozowski |
| 5,221,851 A | * | 6/1993 | Gobrecht et al. ............ 257/177 |
| 5,705,853 A | * | 1/1998 | Faller et al. ................. 257/177 |
| 5,866,944 A | * | 2/1999 | Hiyoshi et al. .............. 257/719 |
| 6,013,572 A | * | 1/2000 | Hur et al. ..................... 257/762 |
| 6,087,682 A | * | 7/2000 | Ando ........................... 257/178 |

FOREIGN PATENT DOCUMENTS

| | | |
|---|---|---|
| DE | 1 949 731 | 4/1971 |
| DE | 2 257 078 | 5/1974 |
| DE | 28 25 682 | 12/1979 |
| DE | 197 21 061 | 11/1997 |
| EP | 0 702 406 A2 | 3/1996 |

OTHER PUBLICATIONS

SGTE Phase Diagram collection, 1990.*

* cited by examiner

Primary Examiner—Mark V. Prenty
(74) Attorney, Agent, or Firm—Oblon, Spivak, McClelland, Maier & Neustadt, P.C.

(57) ABSTRACT

In an IGBT module which is made contact with by pressure and comprises a plurality of individual chips (4) connected in parallel, an additional layer (7) facilitates a stable short circuit. The layer (7), as a foil, as a paste or as a component of the solder, is brought into contact with the main electrodes (5,6) of the semiconductor chip (4). The layer (7) contains, for example, Ag and, together with the semiconductor material, forms a eutectic mixture whose melting point is below that of the two partner materials.

21 Claims, 1 Drawing Sheet

SHORT-CIRCUIT-RESISTANT IGBT MODULE

BACKGROUND OF THE INVENTION

1. Field of the Invention

The present invention relates to the field of power electronics. It concerns a high-power semiconductor module as claimed in the preamble of the first claim, in particular an IGBT (Insulated Gate Bipolar Transistor) module.

2. Discussion of Background

In the case of thyristors in which contact is made by pressure, for example, it has been found that a defect leads to a short circuit. With large chip areas, this short circuit remains stable over a long time. If redundant thyristors are provided in a stack of thryistors connected in series, then the remaining, intact thyristors withstand the voltage during the switched-off phase, and the stack remains operative. Defective thyristors can be replaced subsequently in the course of planned servicing work.

In a thyristor module, the semiconductor, that is to say the Si, is in mechanical and electrical contact between two Mo wafers. Si has a melting point of 1420° C., that of the Mo is higher, and the intermetallic compounds of Si and Mo have an even higher melting point. Thus, in the event of a defect, the Si melts locally first of all and, as current flows, it forms a conductive channel composed of molten Si over the entire thickness of the semiconductor. This defect zone can propagate and/or move, but will only ever affect a small part of the chip area. In hermetically sealed housings, the molten Si does not oxidize but reacts with Mo to form a type of powder. This process continues until all the Si has been consumed, and may possibly extend over years.

In contrast to thyristor semiconductor components, IGBT chips are not produced as large-area units and, normally, a plurality of small-area individual chips are arranged isolated and alongside one another in the IGBT modules. Such a module is disclosed, for example, in EP 0 499 707 B1.

It is has now been found that no stable short circuits of the type described above can be expected with IGBT modules in which contact is made by pressure. This is primarily due to the reduced area of the individual chips, and the small silicon volume. The pseudo-stable phase of a short circuit lasts for only a few hours in this case. Furthermore, the housings are often deliberately not hermetically sealed, so that the molten silicon can react with oxygen and form insulating $SiO_2$. Without any stable short-circuit path in the defective chip, the worst-case situation which can arise is as follows. If the remaining chips in a module, including the actuation, are still intact, they can withstand voltage during the switched-off phase. The current is then forced through the defective chip and, at voltages up to the break down voltage of the intact chips, can lead to a plasma being formed, with a very high power density. This results in the entire module being destroyed.

SUMMARY OF THE INVENTION

Accordingly, the object of the present invention is to provide a novel power semiconductor module which is formed from small-area individual chips and in which a short circuit of an individual chip does not lead to total failure of the module. In the case of a component of the type mentioned above, the object is achieved by the features of the first claim.

The essence of the invention is that a layer composed of a suitable material, for example, Ag, is brought into direct contact with one or both of the main electrodes of the Si semiconductor. The material of this layer must form a eutectic mixture with Si. In the event of a short circuit, the entire sandwich structure is heated and, once the melting point of the eutectic mixture is reached, a conductive melt starts to form on the contact surface between the said layer and the Si. This zone can then expand over the entire thickness of the semiconductor, and thus form a metallically conductive channel.

According to the invention, in the event of damage, a stable short circuit is facilitated by a metallically conductive channel being formed between the main electrodes of the affected Si semiconductor chip. This channel is limited to one part of the chip area, but carries the entire rated current, and thus prevents further heating of the rest of the Si. The melting point of the metallically conductive melt in this channel, or of the corresponding solid compound containing silicon and silver, must thus necessarily be below the melting point of pure Si.

BRIEF DESCRIPTION OF THE DRAWING

A more complete appreciation of the invention and many of the attendant advantages thereof will be readily obtained as the same becomes better understood by reference to the following detailed description when considered in connection with the accompanying drawing, wherein.

DESCRIPTION OF THE PREFERRED EMBODIMENTS

Figure 1:
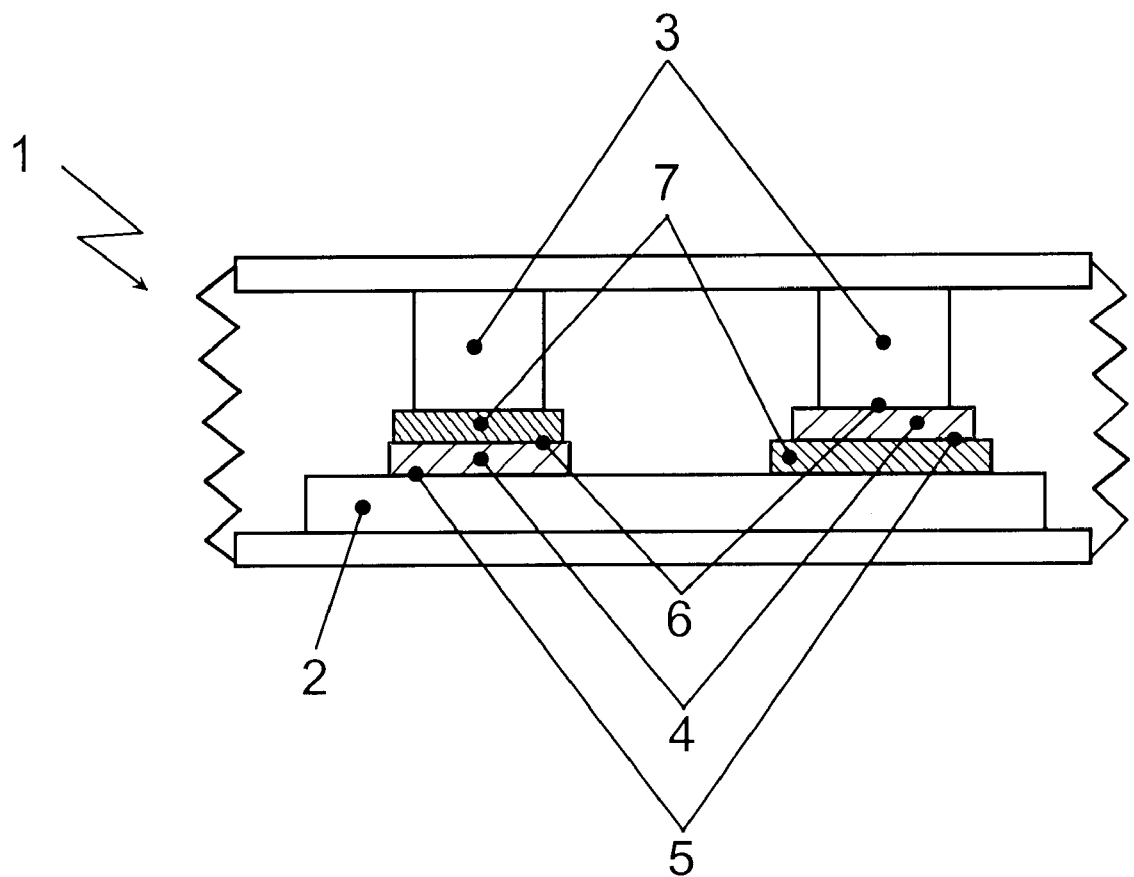
FIG. 1 shows a cross section through a power semiconductor module according to the invention. The illustration is not to scale.

Referring now to the drawings, FIG. 1 shows a cross section through a preferred exemplary embodiment of a high-power semiconductor module according to the invention. A large number of individual semiconductor chips (4) are arranged isolated and alongside one another in a common housing 1, although only two individual chips are shown in FIG. 1. These chips are electrically connected in parallel, and the active semiconductor area required for high currents is in this way composed of a large number of individual surfaces. FIG. 1 does not show the normally bonded gate connections for actuating the semiconductor component.

The semiconductor chips 4 have a metallized main electrode 5, 6 on both the top face and bottom face, which make electrical contact with metallic contact surfaces. The chips are mounted on a conductive substrate 2, and a contact piston 3 is arranged directly above each chip. Further foils or wafers, which are not shown in FIG. 1 but whose thermal expansion is matched to that of silicon, can be provided between the first main electrode 5 and the substrate 2 on the one hand, and between the second main electrode 6 and the contact piston 3 on the other hand. These foils or wafers are produced, for example, from materials such as Mo, Cu, or Mo—Cu composites.

In a first embodiment, an adequate electrical contact is produced exclusively by pressure which is exerted on the end surfaces of the housing 1. In this case, the contact pistons 3 press against the second main electrode 6 and thus make contact with the chip 4. This embodiment thus uses no solder. The layer 7 according to the invention is located between one of the main electrodes 5, 6 and the adjacent metallic contact surface. It is also feasible for a layer 7 according to the invention to be applied subsequently to each of the two main electrodes. The layer 7 according to the invention is most easily produced by means of a foil composed of the appropriate material or is applied to the main electrodes as a paste, and preferably contains Ag. In general, the thickness of the layer 7 according to the invention should be chosen to be greater than half the thickness of the semiconductor 4. Thin metallization layers are not sufficient to form a continuous conductive channel.

In a second embodiment, in which contact is not exclusively made by pressure, solder layers are provided between the main electrodes 5,6 and the metallic contact surfaces in order to produce a cohesive material joint. The solder layer can, for example, make contact with a first main electrode 5, 6, and the additional layer 7 according to the invention can make contact with the opposite main electrode 6, 5. Furthermore, the solder layer can also make direct contact with the layer 7 according to the invention, in which case the opposite side is optionally made contact with by pressure or is soldered. A further embodiment, in which the solder layer and the layer 7 according to the invention are identical, is highly advantageous. In this case, the solder contains at least one component which, together with the silicon, forms a eutectic mixture.

Ag is a suitable eutectic partner for an Si semiconductor chip. The melting point of an AgSi alloy with 11% by atomic weight of Ag (eutectic point) is 835° C., and is thus considerably below that of pure Si. Experiments with Ag have led to reproducibly stable short circuits with current carrying capacities of up to 1500 A rated current per individual chip (chip area 12×12 mm), and for a duration of more than 1000 hours. However, Au, Cu, Mg or Al are also feasible, although, owing to its susceptibility to oxidation, Al is preferably in hermetically sealed housings. In general, other materials are, of course, also feasible, particularly if a different semiconductor material is chosen.

The eutectic partner need not be in pure form, but may itself be part of a compound or alloy, for example in the form of a solder containing silver. The melting point of such a compound is advantageously below that of the eutectic mixture. The eutectic partner should comprise at least 10 percent by volume of the compound or alloy.

In all the embodiments described above, the situation in the event of damage is as follows: the primary damage event is a short circuit in an individual chip, after which the entire rated current flows through this chip. The sandwich structure comprising the semiconductor chip 4, the electrodes 5, 6 and the layer 7 according to the invention is heated until a melt containing silicon is formed once the eutectic point is reached. If the layer according to the invention is sufficiently thick, a conductive channel composed of melt can be formed through the entire chip, starting from the contact surface. This channel carries the current and prevents the sandwich structure from being heated to the melting point of pure Si.

The explanations above have not described the nature and internal structure of the semiconductor chips themselves. If, overall, the module represents an IGBT module, the internal structure corresponds to that of an IGBT or a diode, although the invention can also be applied to other small-area semiconductor components.

Obviously, numerous modifications and variations of the present invention are possible in light of the above teachings. It is therefore to be understood that, within the scope of the appended claims, the invention may be practiced otherwise than as specifically described herein.

LIST OF DESIGNATIONS

| | |
|---|---|
| 1 | Housing |
| 2 | Substrate |
| 3 | Contact piston |
| 4 | Semiconductor chip |
| 5, 6 | Main electrodes |
| 7 | Layer |

What is claimed is:

1. A power semiconductor module comprising:
a) a substrate;
b) a contact piston;
c) a semiconductor chip including:
 1) a first main electrode that makes electrical contact with the substrate; and
 2) a second main electrode that makes electrical contact with the contact piston;
d) an electrically conductive layer provided between one of the first and second main electrodes and the substrate or the contact piston, the electrically conductive layer being a foil or a paste, and containing an alloy-forming material that, together with the semiconductor material, forms a compound or an alloy whose melting point is below that of the semiconductor material; and
e) a housing containing the substrate, contact piston, semiconductor chip and electrically conductive layer.

2. The power semiconductor module of claim 1, wherein:
the electrically conductive layer has a thickness equal to at least half a thickness of the semiconductor chip.

3. The power semiconductor module of claim 2, wherein:
the compound or alloy has a melting point below 900° C.

4. The power semiconductor module of claim 3, wherein:
the semiconductor material is Si; and
the alloy-forming material contains one of a group including elements Al, Ag, Au, Cu or Mg or a compound of the elements.

5. The power semiconductor module of claim 4, wherein:
the alloy-forming material is at least ten percent by volume of the electrically conductive layer.

6. The power semiconductor module of claim 5, wherein:
the semiconductor chip is one of a group including an IGBT and a diode.

7. The power semiconductor module of claim 6, wherein:
the housing does not surround the semiconductor chip in an airtight manner.

8. The power semiconductor module of any one of claims 1 through 7, wherein:
the electrically conductive layer constitutes a foil soldered to the semiconductor chip by means of a solder containing the alloy-forming material.

9. A power semiconductor module comprising:
a) a substrate;
b) a contact piston;
c) a semiconductor chip including:
 1) a first main electrode that makes electrical contact with the substrate; and
 2) a second main electrode that makes electrical contact with the contact piston;
d) an electrically conductive layer provided between one of the first and second main electrodes and the substrate or the contact piston, the electrically conductive layer containing an alloy-forming material that, together with the semiconductor material, forms a compound or an alloy whose melting point is below that of the semiconductor material, an electrical contact between the one of the first and second main electrodes and the electrically conductive layer being produced exclusively by pressure; and e) a housing containing the substrate, contact piston, semiconductor chip and electrically conductive layer.

10. The power semiconductor module of claim 9, wherein:

the electrically conductive layer is a foil or a paste.

11. The power semiconductor module of claim 9 or claim 10, wherein:

the electrically conductive layer has a thickness equal to at least half a thickness of the semiconductor chip.

12. The power semiconductor module of claim 11, wherein:

the compound or alloy has a melting point below 900° C.

13. The power semiconductor module of claim 12, wherein:

the semiconductor material is Si; and the alloy-forming material contains one of a group including elements Al, Ag, Au, Cu or Mg or a compound of the elements.

14. The power semiconductor module of claim 13, wherein:

the semiconductor chip is one of a group including an IGBT and a diode.

15. The power semiconductor module of claim 14, wherein:

the housing does not surround the semiconductor chip in an airtight manner.

16. A power semiconductor module comprising:

a) a substrate;

b) a contact piston;

c) a semiconductor chip including:
  1) a first main electrode that makes electrical contact with the substrate; and
  2) a second main electrode that makes electrical contact with the contact piston;

d) an electrically conductive layer provided between one of the first and second main electrodes and the substrate or the contact piston, the electrically conductive layer containing an alloy-forming material that, together with the semiconductor material, forms a compound or an alloy whose melting point is below that of the semiconductor material, the alloy-forming material being at least ten percent by volume of the electrically conductive layer; and e) a housing containing the substrate, contact piston, semiconductor chip and electrically conductive layer.

17. The power semiconductor module of claim 16, wherein: the electrically conductive layer has a thickness equal to at least half a thickness of the semiconductor chip.

18. The power semiconductor module of claim 16 or claim 17, wherein: the compound or alloy has a melting point below 900° C.

19. The power semiconductor module of claim 18, wherein:

the semiconductor material is Si; and the alloy-forming material contains one of a group including elements Al, Ag, Au, Cu or Mg or a compound of the elements.

20. The power semiconductor module of claim 19, wherein:

the semiconductor chip is one of a group including an IGBT and a diode.

21. The power semiconductor module of claim 20, wherein: the housing does not surround the semiconductor chip in an airtight manner.

* * * * *